United States Patent
Li et al.

(10) Patent No.: US 7,256,465 B2
(45) Date of Patent: Aug. 14, 2007

(54) ULTRA-SHALLOW METAL OXIDE SURFACE CHANNEL MOS TRANSISTOR

(75) Inventors: Tingkai Li, Vancouver, WA (US); Sheng Teng Hsu, Camas, WA (US); Bruce D. Ulrich, Beaverton, OR (US)

(73) Assignee: Sharp Laboratories of America, Inc., Camas, WA (US)

(*) Notice: Subject to any disclaimer, the term of this patent is extended or adjusted under 35 U.S.C. 154(b) by 205 days.

(21) Appl. No.: 10/761,704

(22) Filed: Jan. 21, 2004

(65) Prior Publication Data
US 2005/0156254 A1    Jul. 21, 2005

(51) Int. Cl.
  *H01L 21/336* (2006.01)
  *H01L 29/94* (2006.01)
(52) U.S. Cl. .............. 257/410; 257/411; 257/288; 257/289; 438/215; 438/261
(58) Field of Classification Search ........... 257/288, 257/616, 310, 297, 300, 289, 290; 438/289, 438/217, 231, 226, 303
See application file for complete search history.

(56) References Cited

U.S. PATENT DOCUMENTS

| | | | |
|---|---|---|---|
| 6,621,114 B1 * | 9/2003 | Kim et al. | 257/310 |
| 6,656,852 B2 * | 12/2003 | Rotondaro et al. | 438/749 |
| 6,753,230 B2 * | 6/2004 | Sohn et al. | 438/289 |
| 6,794,234 B2 * | 9/2004 | Polishchuk et al. | 438/199 |
| 6,900,094 B2 * | 5/2005 | Hammond et al. | 438/238 |
| 2003/0234439 A1 * | 12/2003 | Currie et al. | 257/616 |
| 2004/0150052 A1 * | 8/2004 | Riccardi et al. | 257/369 |
| 2004/0155846 A1 * | 8/2004 | Hoffman et al. | 345/87 |
| 2006/0011983 A1 * | 1/2006 | Fitzgerald | 257/350 |

* cited by examiner

*Primary Examiner*—Sue A. Purvis
*Assistant Examiner*—Fazli Erdem
(74) *Attorney, Agent, or Firm*—Law Office of Gerald Maliszewski; Gerald Maliszewski

(57) ABSTRACT

An ultra-shallow surface channel MOS transistor and method for fabricating the same have been provided. The method comprises: forming CMOS source and drain regions, and an intervening well region; depositing a surface channel on the surface overlying the well region; forming a high-k dielectric overlying the surface channel; and, forming a gate electrode overlying the high-k dielectric. Typically, the surface channel is a metal oxide, and may be one of the following materials: indium oxide ($In_2O_3$), ZnO, RuO, ITO, or $LaX-1SrXCoO_3$. In some aspects, the method further comprises: depositing a placeholder material overlying the surface channel; and, etching the placeholder material to form a gate region overlying the surface channel. In one aspect, the high-k dielectric is deposited prior to the deposition of the placeholder material. Alternately, the high-k dielectric is deposited following the etching of the placeholder material.

13 Claims, 4 Drawing Sheets

ULTRA-SHALLOW METAL OXIDE SURFACE CHANNEL MOS TRANSISTOR

BACKGROUND OF THE INVENTION

1. Field of the Invention

This invention generally relates to integrated circuit (IC) fabrication and, more particularly, to a MOS transistor with a shallow metal oxide surface channel, and a method for fabricating the same.

2. Description of the Related Art

State-of-the-art CMOS transistors are often made using a gate material having a high work function, which corresponds to a high threshold voltage. For example, P+ polysilicon and N+ polysilicon (polySi) are used as the gate electrodes for nMOS and pMOS transistors, respectively. These poly gate transistors can be made using simple, lower cost fabrication processes, and the end product is reliable. High work function polySi gate electrodes are formed as a result of a high surface doping density. However, the high surface doping density reduces the electron and hole mobility, degrading transistor performance parameters such as switching time.

Gate electrodes can also be formed from metals, which have a relatively high work function as compared to polySi. However, metal gate transistors require the use of a different metal for nMOS transistors, than is used for pMOS transistors. This two-metal gate electrode approach adds to process complications and costs.

It would be advantageous if a high performance CMOS transistor could be fabricated, that also had a high work function.

It would be advantageous if the above-mentioned transistor could be fabricated without the use of highly doped polySi, or two-metal gate electrode materials.

SUMMARY OF THE INVENTION

The present invention transistor device structure uses a semiconductive metal oxide as conductive channel. This structure permits a single metal, with mid-gap work function, to be used for both n-channel and p-channel transistors. As a result of using only a single gate electrode material for both types of transistors, the fabrication process is greatly simplified.

Accordingly, a method is provided for fabricating an ultra-shallow surface channel MOS transistor. The method comprises: forming CMOS source and drain regions, and an intervening well region; depositing a surface channel on the surface overlying the well region; forming a high-k dielectric overlying the surface channel; and, forming a gate electrode overlying the high-k dielectric. Typically, the surface channel is a metal oxide, and may be one of the following materials: indium oxide (In2O3), ZnO, RuO, ITO, or LaX-1SrXCoO3.

In some aspects, the method further comprises: depositing a placeholder material overlying the surface channel; conformally depositing oxide; and, etching the placeholder material to form a gate region overlying the surface channel. In one aspect, the high-k dielectric is deposited prior to the deposition of the placeholder material, and the placeholder is etched to the level of the high-k dielectric. Alternately, the high-k dielectric is deposited following the etching of the placeholder material to form the gate region, and the gate electrode is deposited overlying the high-k dielectric.

Additional details of the above-described method and an ultra-shallow surface channel MOS transistor are provided below.

DETAILED DESCRIPTION OF THE PREFERRED EMBODIMENTS

Figure 1:
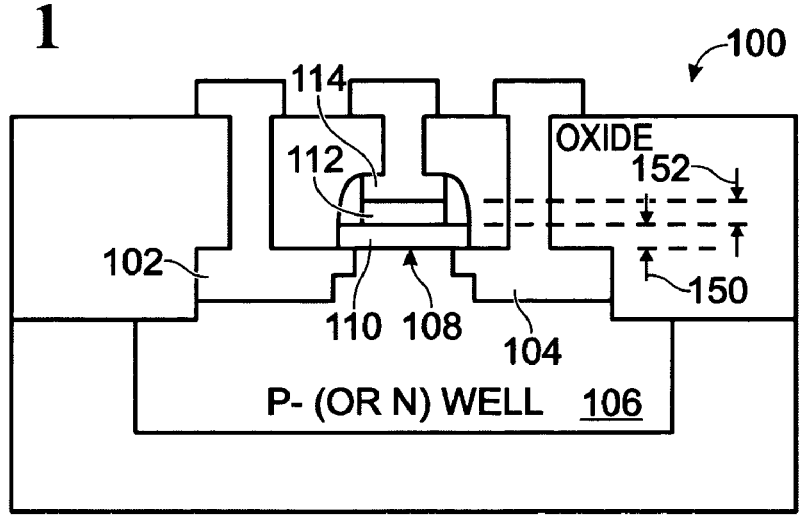
FIG. 1 is a partial cross-section view of the present invention ultra-shallow surface channel MOS transistor.
Figure 2:
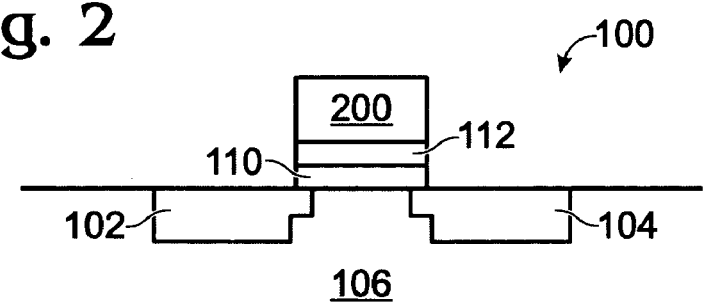
FIG. 2 is a partial cross-sectional view, showing a step in the fabrication of the transistor of FIG. 1.

FIG. 1 is a partial cross-section view of the present invention ultra-shallow surface channel MOS transistor. The transistor 100 comprises a source region 102 and a drain region 104. A well region 106 intervenes between the source 102 and drain 104, and has a surface 108. A surface channel 110 overlies the well region 106. A high-k dielectric insulator 112 overlies the surface channel 110. A gate electrode 114 overlies the high-k dielectric insulator layer 112. Typically, the surface channel 110 is a metal oxide material. For example, the metal oxide surface channel 110 can be a material such as indium oxide ($In_2O_3$), ZnO, RuO, ITO, or $La_{X-1}Sr_XCoO_3$. However, other metal oxide materials, not specifically mentioned, can also be used FIG. 2 is a partial cross-sectional view, showing a step in the fabrication of the transistor 100 of FIG. 1. In this aspect, the transistor 100 further comprises a placeholder 200 overlying the surface channel 110. More specifically, the placeholder 200 is temporarily formed directly overlying the high-k dielectric 112. Typically, the placeholder 200 is Si or polySi. However, other materials may also be used. An LDD process can be performed after the deposition of the placeholder 200.

Figure 3:
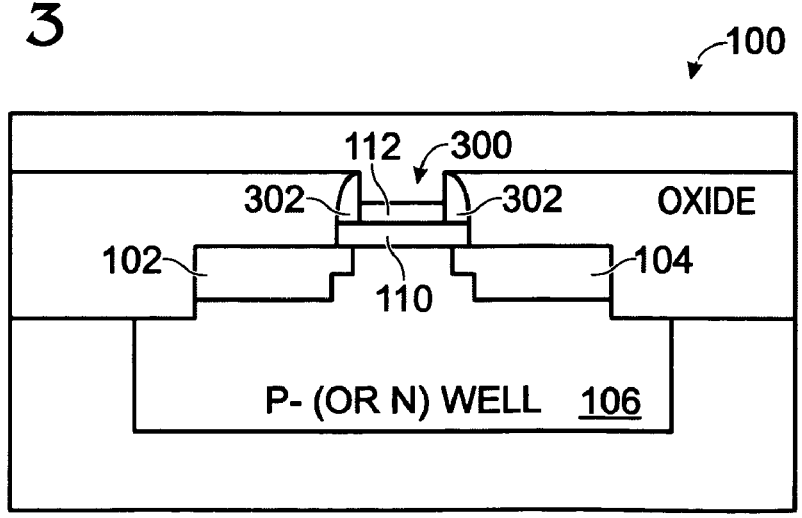
FIG. 3 is a partial cross-sectional view of the transistor of FIG. 2, following an etch of the placeholder.

FIG. 3 is a partial cross-sectional view of the transistor 100 of FIG. 2, following an etch of the placeholder 200. The etch process forms a temporary gate region 300, and the gate electrode is formed in the gate region 300. Referencing both FIGS. 2 and 3, it can be seen that the placeholder temporarily overlies the high-k dielectric insulator 112, before being etched away. The transistor 100 further comprises sidewall insulators 302 adjacent the surface channel 110, high-k dielectric insulator 112, and the gate region 300. The sidewalls 302 can be a material such as $Si_3N_4$ or $Al_2O_3$. With the sidewalls 302 in place, heavy source and drain implantation may be performed.

Figure 4:
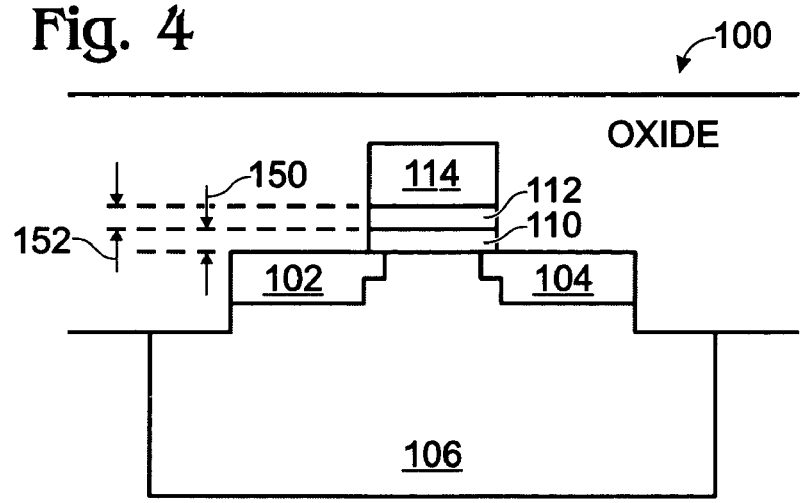
FIG. 4 is a partial cross-sectional view of an alternate aspect of the transistor of FIG. 1.

FIG. 4 is a partial cross-sectional view of an alternate aspect of the transistor of FIG. 1. In this aspect of the invention, there are no sidewall insulators, as the heavy source and drain implantation occurs prior to the deposition of the surface channel 110.

Figure 5:
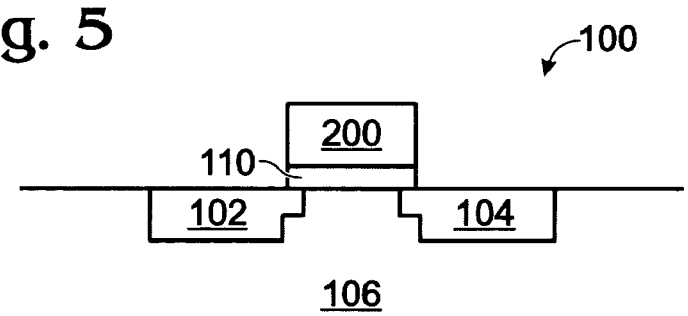
FIG. 5 is a partial cross-sectional view, showing a step in the fabrication of the transistor of FIG. 4.

FIG. 5 is a partial cross-sectional view, showing a step in the fabrication of the transistor 100 of FIG. 4. In this aspect, the transistor 100 comprises a placeholder 200 overlying the surface channel 110. That is, the placeholder 200 is temporarily formed directly overlying the surface channel 110, whereas in the aspect of FIG. 2, the placeholder 200 temporarily overlies the high-k dielectric 112.

Figure 6:
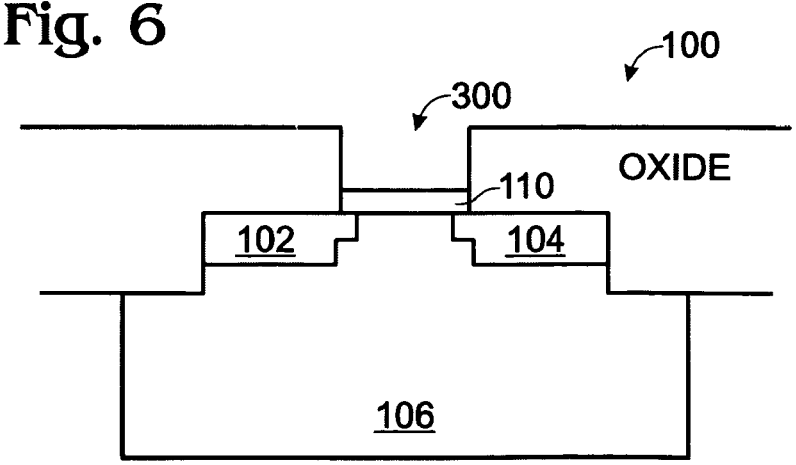
FIG. 6 is a partial cross-sectional view of the transistor of FIG. 5, following an etch of the placeholder.

FIG. 6 is a partial cross-sectional view of the transistor 100 of FIG. 5, following an etch of the placeholder 200. The etch process forms a temporary gate region 300. The high-k dielectric insulator 112 is formed in the gate region 300 overlying the surface channel 110. Then, the gate electrode is formed in the gate region 300, overlying the high-k dielectric 112 (see FIG. 4).

Referencing either FIG. 1 or 4, metal oxide surface channel 110 has a thickness 150 in the range in the range of 10 to 20 nanometers (nm). Note, the thickness 150 is dependent upon factors such as the channel length, device size, or the resistivity of the metal oxide. In one aspect, the metal oxide surface channel 110 has a resistivity in the range between 0.1 and 1000 ohm-cm. The resistivity is dependent upon desired transistor operating characteristics. The high-k dielectric insulator 112 is a material such as $HfO_2$, $HfAlO_x$, $ZrO_2$, or $Al_2O_3$. The high-k dielectric insulator 112 may have a thickness 152 in the range of 1 to 5 nm. Note, the thickness 152 is dependent upon the channel length of the transistor 100.

FUNCTIONAL DESCRIPTION

Returning to FIG. 1, the gate stack of the present invention transistor device consists of a metal gate, a high-k dielectric gate insulator, and a semiconductive metal oxide. The well can be either P- or N-type silicon. The well, source, and drain can be formed using conventional processes. One difference between the present invention device and a conventional MOS transistor, is that the present invention uses a very thin semiconductor metal oxide as the conductive channel.

As mentioned above, the present invention device can be fabricated using many conventional processes. The device isolation and P- (or N-) well may be formed using any of the state of the art process. However, the well doping density can be much higher than a conventional process, to avoid the short channel effect. Additional fabrication process can be as follows:

1. Deposit an un-doped semiconductive metal oxide of thickness 10 nm to 20 nm.
2. Deposit a thin layer of high-k gate dielectric insulator. The material can be any high-k dielectric, such as $HfO_2$, $HfAlO_x$, $ZrO_2$, $Al_2O_3$, etc. The thickness may be from 1 nm to 5 nm, depending on the channel length of the device.
3. Deposit a layer of material such as polysilicon, but not $Si_3N_4$, and pattern to form a sacrificial gate placeholder. The thickness of this material is essentially the same as that of the metal gate material. During patterning, the sacrificial gate placeholder, the high-K dielectric, but not semiconductive metal oxide, are also etched.
4. LDD ion implant, followed by sidewall insulator formation. The sidewall insulator may be $Si_3N_4$. During sidewall etching, the semiconductive metal oxide is also (partially) etched. A heavy ion implantation and activation follow, to completely form the source/drain regions of the device.
5. Deposit oxide having thickness about 1.2 to 1.5 time thicker than that of the material deposited in step 3. CMP the oxide, stopping at the sacrificial gate placeholder.
6. Selectively etch the sacrificial gate placeholder.
7. Deposit metal and CMP metal to form gate electrode.
8. Deposit additional oxide for device passivation.
9. Form contact holes using a photoresist process to etch the oxide.
10. Deposit metal and pattern to form metal interlevel interconnects.

The above-mentioned steps refer essentially to the device shown in FIGS. 1-3. The present invention device may also be made using various other processes, such as non-self-aligned processes where the source and drain are formed before the deposition of semiconductive metal oxide channel. The high-k gate dielectric is then deposited after the gate placeholder removal. This aspect of the invention is shown in FIGS. 4-6.

Figure 7:
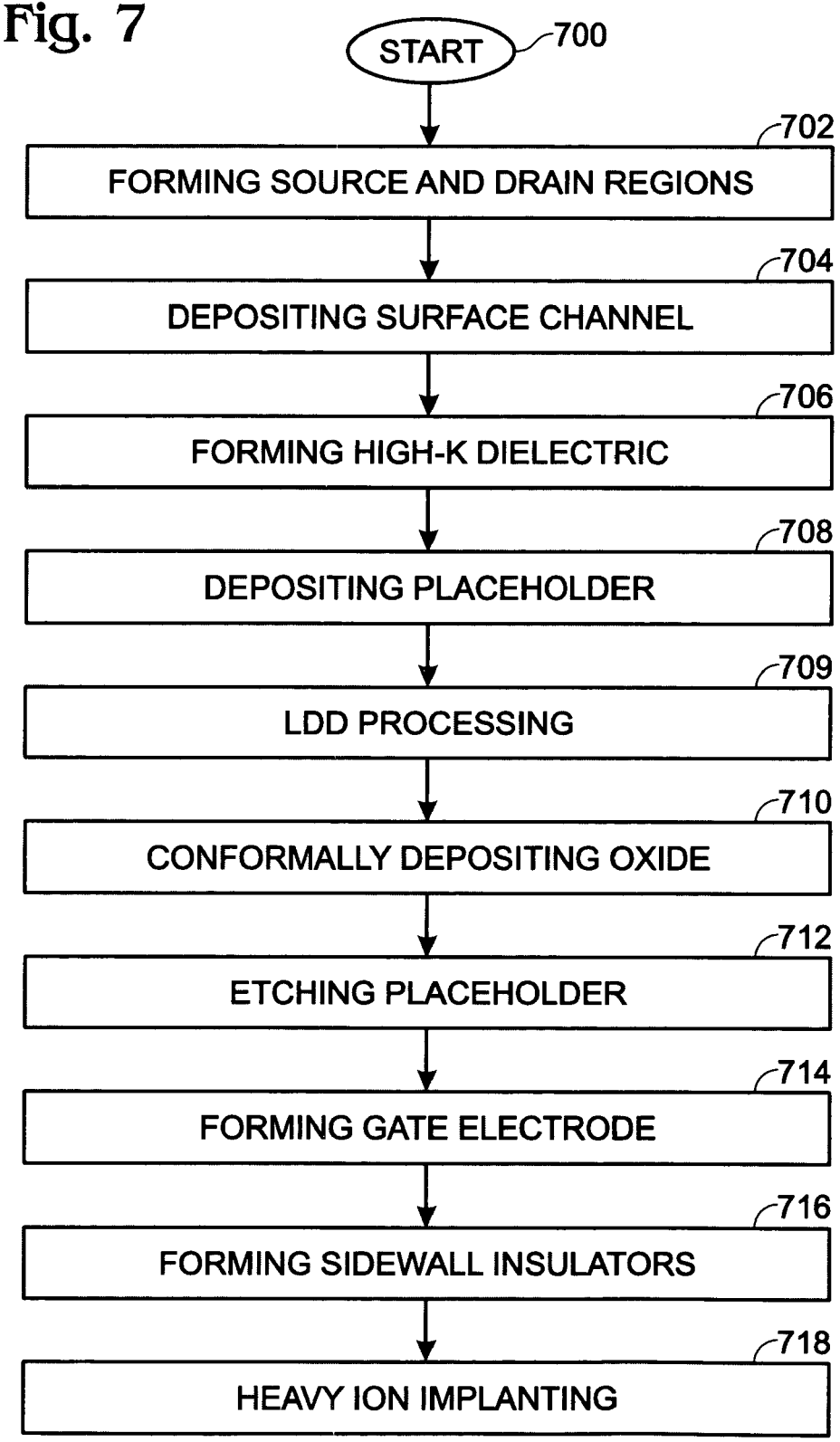
FIG. 7 is a flowchart illustrating the present invention method for fabricating an ultra-shallow surface channel MOS transistor.

FIG. 7 is a flowchart illustrating the present invention method for fabricating an ultra-shallow surface channel MOS transistor. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 700.

Step 702 forms CMOS source and drain regions with a surface, and an intervening well region with a surface. Step 704 deposits a surface channel on the surface overlying the well region. Step 706 forms a high-k dielectric overlying the surface channel. Step 708 deposits a placeholder material overlying the surface channel. Step 710 conformally deposits oxide. Step 712 etches the placeholder material to form a gate region overlying the surface channel. Step 714 forms a gate electrode overlying the high-k dielectric. That is, Step 714 forms the gate electrode in the gate region.

In one aspect of the method, Step 709, following the deposition of the placeholder material (Step 708), lightly doped drain (LDD) processes the source and drain regions. Then, forming a high-k dielectric insulator overlying the surface channel (Step 706) includes depositing the high-k dielectric prior to the deposition of the placeholder material. Step 716 forms sidewall insulators adjacent the surface channel, high-k dielectric insulator, and gate region. Step 718 heavy ion implants and activates the source and drain regions.

In some aspects, forming sidewall insulators adjacent the surface channel, high-k dielectric insulator, and gate region (Step 716) includes forming sidewalls from a material such as $Si_3N_4$ or $Al_2O_3$. However, other insulator materials are known in the art.

Figure 8:
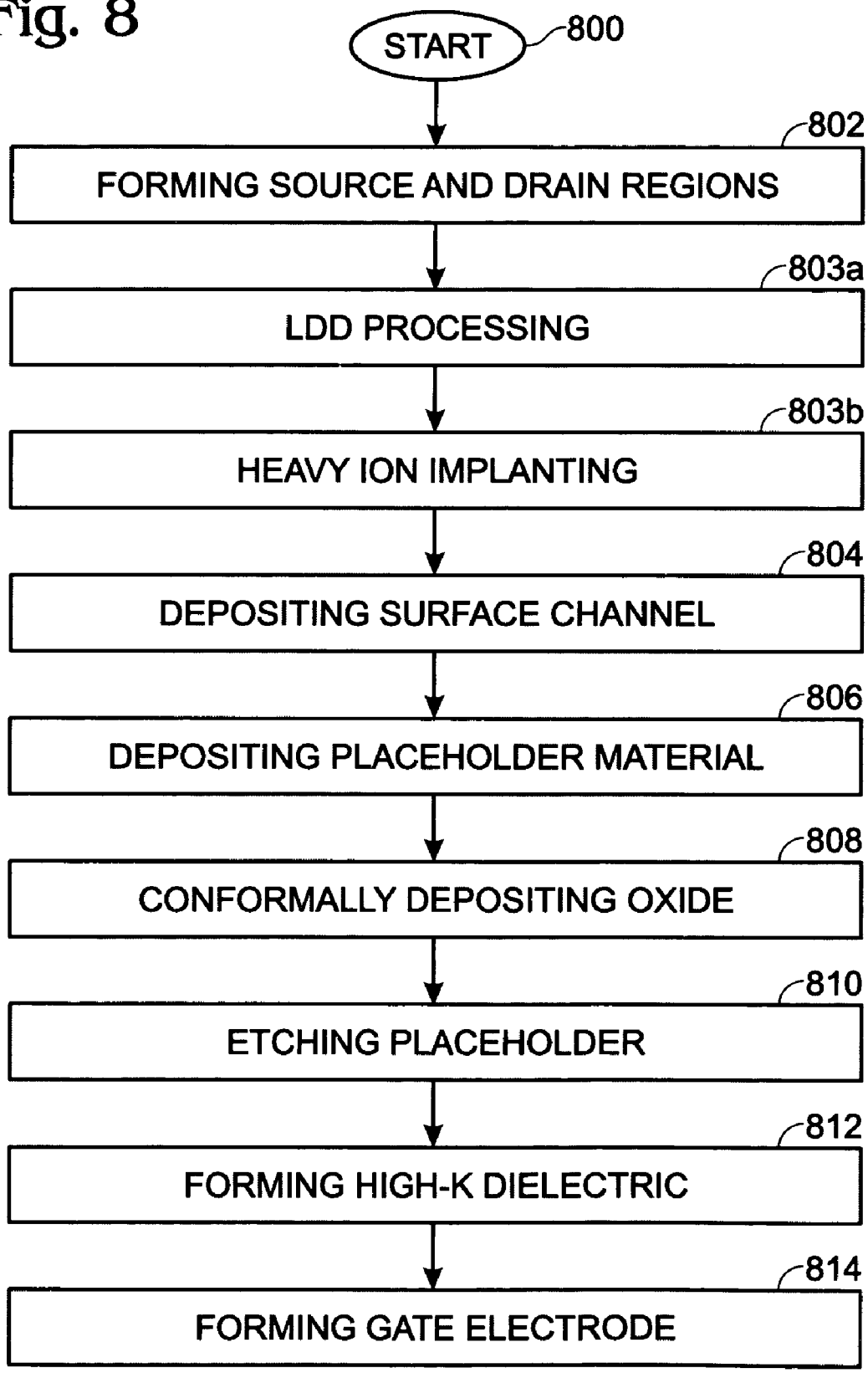
FIG. 8 is a flowchart illustrating an alternate aspect of the method of FIG. 7.

FIG. 8 is a flowchart illustrating an alternate aspect of the method of FIG. 7. The method starts at Step 800. Step 802 forms CMOS source and drain regions, and an intervening well region with a surface. Step 804 deposits a surface channel on the surface overlying the well region. Step 806 deposits a placeholder material overlying the surface channel. Step 808 conformally deposits oxide. Step 810 etches the placeholder material to form a gate region overlying the surface channel. Step 812 forms a high-k dielectric overlying the surface channel. Step 814 forms a gate electrode overlying the high-k dielectric. That is, Step 814 forms the gate electrode in the gate region.

In this aspect, Step 803a, prior to the deposition of the surface channel, lightly doped drain (LDD) processes the source and drain regions. Step 803b heavy ion implants and activates the source and drain regions. Unlike the method of FIG. 7, the step of forming a high-k dielectric insulator overlying the surface channel (Step 812) follows the etching of the placeholder material to form the gate region (Step 810).

Referencing either FIG. 7 or FIG. 8, depositing a surface channel on the surface overlying the well region in Step 704 (804) includes depositing a metal oxide surface channel material. The metal oxide can be a material selected from the group including indium oxide ($In_2O_3$), ZnO, RuO, ITO, $Lax_{-1}SrxCoO_3$. In other aspects, Step 704 (804) includes depositing metal oxide to a thickness in the range in the range of 10 to 20 nanometers (nm). In a different aspect, Step 704 (804) deposits a metal oxide having a resistivity in the range between 0.1 and 1000 ohm-cm. Forming a high-k dielectric insulator overlying the surface channel Step 706 (812) includes depositing a high-k dielectric material selected from the group including $HfO_2$, $HfAlO_x$, $ZrO_2$, and $Al_3O_4$. In some aspects, forming a high-k dielectric insulator overlying the surface channel includes depositing the high-k dielectric to a thickness in the range of 1 to 5 nm.

In one aspect, depositing a placeholder material overlying the surface channel Step 708 (806) includes forming placeholder material to a first thickness with a placeholder material surface. Isotropically depositing oxide in Step 710 (808) includes depositing oxide to a second thickness in the range of 1.2 to 1.5 times the first thickness. The method further comprises Step 713 (813) of chemical mechanical polishing (CMP) the oxide to the level of the placeholder material surface. Steps 713 and 813 are not shown.

A shallow surface channel MOS transistor and corresponding fabrication process have been presented. Specific materials have been used as examples to illustrate the invention. However, the above description is not intended to list every possible type of material. Likewise, the mentioned thicknesses and electrical specifications may be modified to suit desired transistor operating characteristics. Other variations and embodiments of the invention will occur to those skilled in the art.

We claim:

1. A method for fabricating an ultra-shallow surface channel MOS transistor, the method comprising:
   forming CMOS source and drain regions, and an intervening well region with a surface;
   depositing a surface channel on the surface overlying the well region;
   forming a high-k dielectric overlying the surface channel;
   depositing a placeholder material overlying the surface channel;
   conformally depositing oxide;
   etching the placeholder material to form a gate region overlying the surface channel; and,
   forming a gate electrode overlying the high-k dielectric in the gate region.

2. The method of claim 1 further comprising:
   following the deposition of the placeholder material, lightly doped drain (LDD) processing the source and drain regions;
   wherein forming a high-k dielectric insulator overlying the surface channel includes depositing the high-k dielectric prior to the deposition of the placeholder material;
   the method further comprising:
   forming sidewall insulators adjacent the surface channel, high-k dielectric insulator, and gate region; and,
   heavy ion implanting and activating the source and drain regions.

3. The method of claim 2 wherein forming sidewall insulators adjacent the surface channel, high-k dielectric insulator, and gate region includes forming sidewalls from a material selected from the group including Si3N4 and Al2O3.

4. The method of claim 1 further comprising:
   prior to the deposition of the surface channel, lightly doped drain (LDD) processing the source and drain regions;
   heavy ion implanting and activating the source and drain regions; and,
   wherein forming a high-k dielectric insulator overlying the surface channel includes depositing the high-k dielectric following the etching of the placeholder material to form the gate region.

5. The method of claim 1 wherein depositing a placeholder material overlying the surface channel includes forming placeholder material to a first thickness with a placeholder material surface; and,
   wherein conformally depositing oxide includes depositing oxide to a second thickness in the range of 1.2 to 1.5 times the first thickness; and,
   the method further comprising:
   chemical mechanical polishing (CMP) the oxide to the level of the placeholder material surface.

6. A method for fabricating an ultra-shallow surface channel MOS transistor, the method comprising:
   forming CMOS source and drain regions, and an intervening well region with a surface;
   depositing a metal oxide surface channel on the surface overlying the well region having a thickness in the range in the range of 10 to 20 nanometers (nm);
   forming a high-k dielectric overlying the surface channel; and,
   forming a gate electrode overlying the high-k dielectric.

7. A method for fabricating an ultra-shallow surface channel MOS transistor, the method comprising:
   forming CMOS source and drain regions, and an intervening well region with a surface;
   depositing a metal oxide surface channel on the surface overlying the well region having a resistivity in the range between 0.1 and 1000 ohm-cm;
   forming a high-k dielectric overlying the surface channel; and,
   forming a gate electrode overlying the high-k dielectric.

8. An ultra-shallow surface channel MOS transistor, the transistor comprising:
   a source region;
   a drain region;
   a well region intervening between the source and drain with a surface;
   a surface channel overlying the well region;
   a high-k dielectric insulator overlying the surface channel;
   a placeholder overlying the surface channel, forming a temporary gate region; and,
   a gate electrode overlying the high-k dielectric layer, formed in the gate region.

9. The transistor of claim 8 wherein the placeholder is temporarily formed directly overlying the high-k dielectric insulator;
   the transistor further comprising:
   sidewall insulators adjacent the surface channel, high-k dielectric insulator, and the gate region.

10. The transistor of claim 9 wherein the sidewall insulators are a material selected from the group including $Si_3N_4$ and $Al_2O_3$.

11. The transistor of claim 8 wherein the placeholder is temporarily formed directly overlying the surface channel.

12. An ultra-shallow surface channel MOS transistor, the transistor comprising:
   a source region;
   a drain region;

a well region intervening between the source and drain with a surface;

a metal oxide surface channel overlying the well region having a thickness in the range in the range of 10 to 20 nanometers (nm);

a high-k dielectric insulator overlying the surface channel; and a gate electrode overlying the high-k dielectric layer.

13. An ultra-shallow surface channel MOS transistor, the transistor comprising:

a source region;

a drain region;

a well region intervening between the source and drain with a surface;

a metal oxide surface channel overlying the well region having a resistivity in the range between 0.1 and 1000 ohm-cm;

a high-k dielectric insulator overlying the surface channel; and a gate electrode overlying the high-k dielectric layer.

* * * * *